(12) United States Patent
Beer et al.

(10) Patent No.: US 9,287,206 B2
(45) Date of Patent: Mar. 15, 2016

(54) METHOD OF FABRICATING A SEMICONDUCTOR DEVICE WITH ENCAPSULANT

(75) Inventors: Gottfried Beer, Nittendorf (DE); Irmgard Escher-Poeppel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 207 days.

(21) Appl. No.: 13/189,998

(22) Filed: Jul. 25, 2011

(65) Prior Publication Data
US 2011/0281405 A1 Nov. 17, 2011

Related U.S. Application Data

(62) Division of application No. 12/185,389, filed on Aug. 4, 2008, now abandoned.

(51) Int. Cl.
*H01L 21/00* (2006.01)
*H01L 23/498* (2006.01)
(Continued)

(52) U.S. Cl.
CPC ........ *H01L 23/49827* (2013.01); *H01L 21/561* (2013.01); *H01L 23/3128* (2013.01); *H01L 23/49816* (2013.01); *H01L 24/19* (2013.01); *H01L 24/96* (2013.01); *H01L 24/97* (2013.01); *H01L 2224/0401* (2013.01); *H01L 2224/04105* (2013.01); *H01L 2224/12105* (2013.01); *H01L 2224/20* (2013.01); *H01L 2224/97* (2013.01); *H01L 2924/014* (2013.01); *H01L 2924/01005* (2013.01); *H01L 2924/01006* (2013.01);
(Continued)

(58) Field of Classification Search
CPC ............ H01L 2224/97; H01L 2924/00; H01L 2224/73265; H01L 2224/48227; H01L 2224/32225; H01L 2924/15311; H01L 2924/00014; H01L 2924/00012; H01L 2224/48091; H01L 2224/73204; H01L 2224/82; H01L 21/561; H01L 2224/04105; H01L 2224/12105; H01L 2224/20; H01L 24/97; H01L 2924/1815
USPC .................................. 438/127; 257/E21.502
See application file for complete search history.

(56) References Cited

U.S. PATENT DOCUMENTS 5,353,498 A 10/1994 Fillion et al.
6,252,301 B1 * 6/2001 Gilleo et al. .................. 257/690
(Continued)

FOREIGN PATENT DOCUMENTS

DE 10103966 3/2002
WO 2006134216 12/2006

OTHER PUBLICATIONS

Brunnbauer, M., et al., "Embedded Wafer Level Ball Grid Array (eWLB)," IEEE Electronics Packaging Technology Conference, pp. 1-5 (2006).
(Continued)

*Primary Examiner* — Duy T Nguyen
(74) *Attorney, Agent, or Firm* — Dicke, Billig & Czaja, PLLC

(57) ABSTRACT

A method of fabricating a semiconductor device and semiconductor device is provided. The method provides a first layer. The first layer includes through-holes. At least one semiconductor chip is provided. The semiconductor chip includes contact elements. The semiconductor chip is placed onto the first layer with the contact elements being aligned with the through-holes. An encapsulant material is applied over the semiconductor chip.

24 Claims, 13 Drawing Sheets

(51) Int. Cl.
    *H01L 21/56* (2006.01)
    *H01L 23/31* (2006.01)
    *H01L 23/00* (2006.01)

(52) U.S. Cl.
    CPC ........... *H01L2924/01013* (2013.01); *H01L 2924/01027* (2013.01); *H01L 2924/01029* (2013.01); *H01L 2924/01047* (2013.01); *H01L 2924/01075* (2013.01); *H01L 2924/01078* (2013.01); *H01L 2924/01079* (2013.01); *H01L 2924/01082* (2013.01); *H01L 2924/12044* (2013.01); *H01L 2924/14* (2013.01); *H01L 2924/1461* (2013.01); *H01L 2924/15311* (2013.01); *H01L 2924/1815* (2013.01)

(56) References Cited

U.S. PATENT DOCUMENTS

| | | | |
|---|---|---|---|
| 6,310,389 B1 * | 10/2001 | Han | 257/668 |
| 6,420,788 B1 | 7/2002 | Chen | |
| 2003/0075532 A1 | 4/2003 | Salmon et al. | |
| 2003/0156402 A1 | 8/2003 | Ding et al. | |
| 2003/0205804 A1 * | 11/2003 | Lee et al. | 257/703 |
| 2004/0168825 A1 | 9/2004 | Sakamoto et al. | |
| 2005/0121765 A1 | 6/2005 | Lin | |
| 2006/0009026 A1 * | 1/2006 | Sawaguchi et al. | 438/622 |
| 2006/0278997 A1 * | 12/2006 | Gibson et al. | 257/778 |
| 2007/0001266 A1 | 1/2007 | Arana et al. | |
| 2007/0235871 A1 | 10/2007 | Huang et al. | |
| 2008/0134936 A1 * | 6/2008 | Kamikoriyama et al. | 106/31.92 |
| 2008/0202801 A1 * | 8/2008 | Tuominen et al. | 174/260 |

OTHER PUBLICATIONS

Office Action for U.S. Appl. No. 12/185,389 mailed Dec. 2, 2009 (12 pages).

Final Office Action for U.S. Appl. No. 12/185,389 mailed Jun. 1, 2010 (11 pages).

Office Action for U.S. Appl. No. 12/185,389 mailed Jan. 14, 2011 (13 pages).

Final Office Action for U.S. Appl. No. 12/185,389 mailed May 17, 2011 (13 pages).

* cited by examiner

FIG 2
A
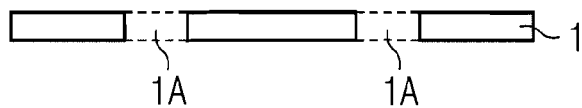
B
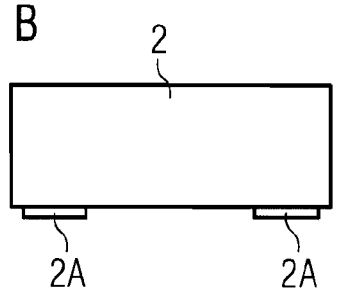
C
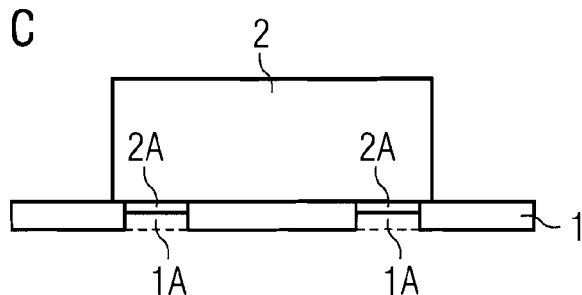
D
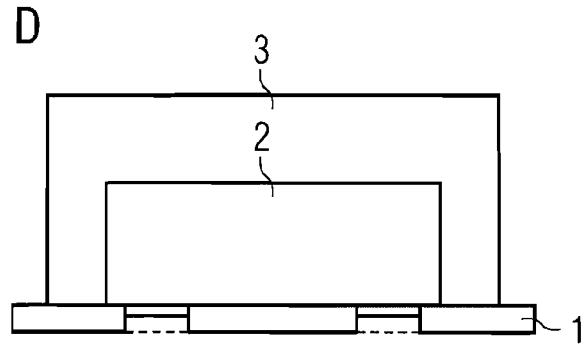

FIG 4
A
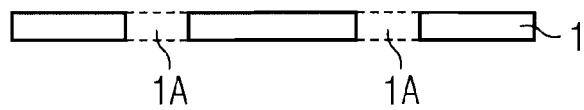
B
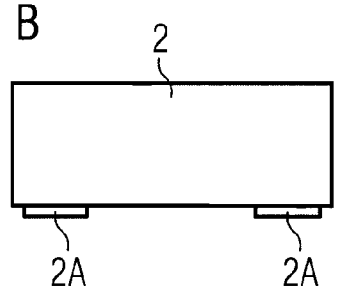
C
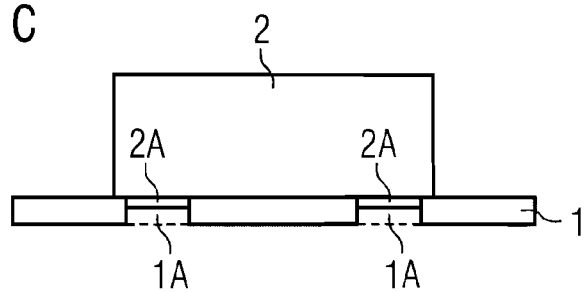
D
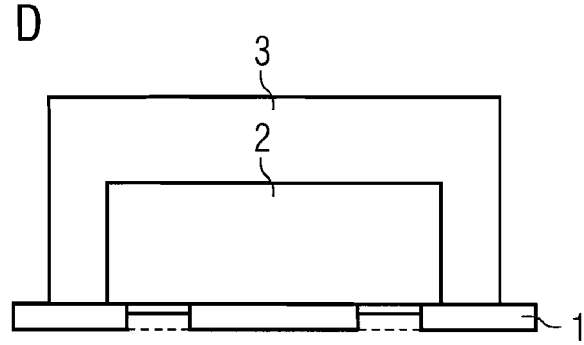

FIG 5
A
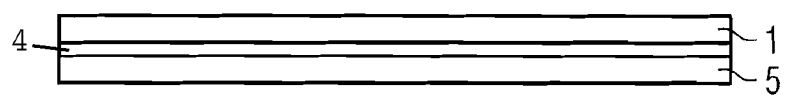
B
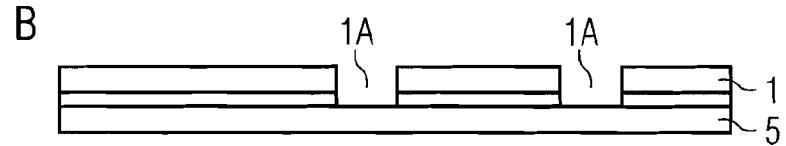
C
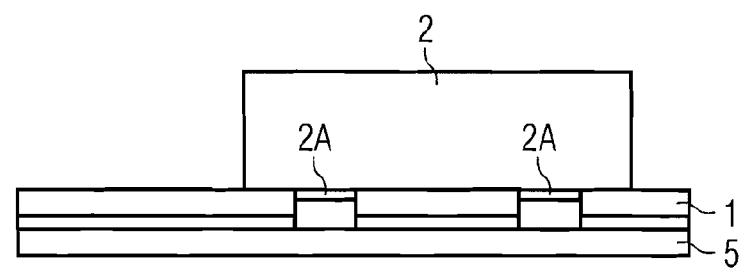
D
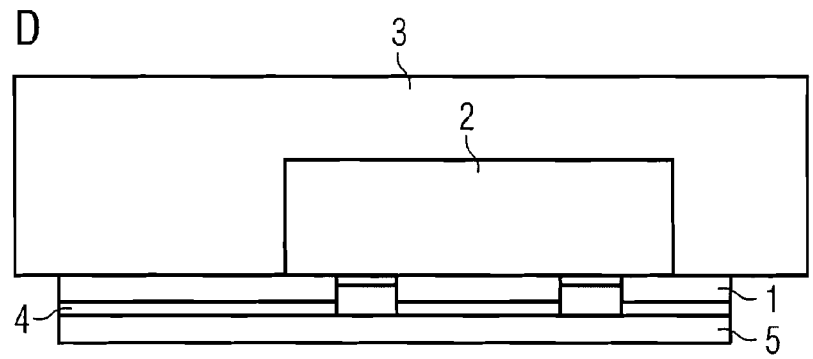

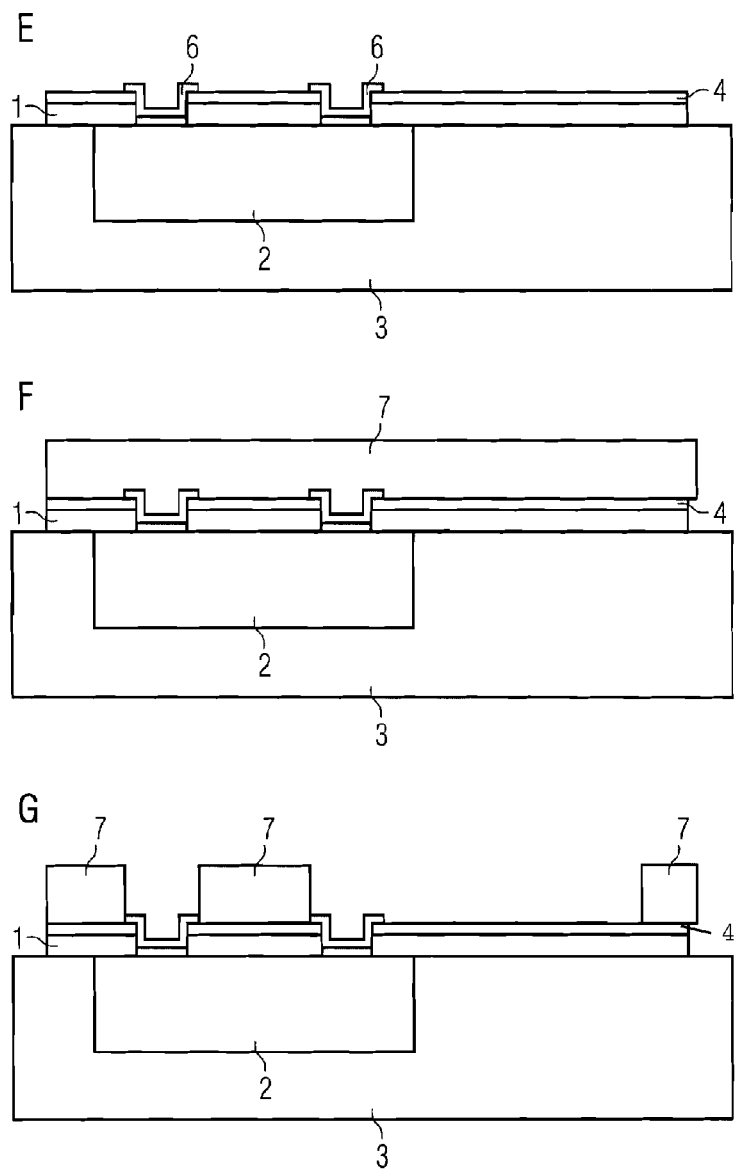

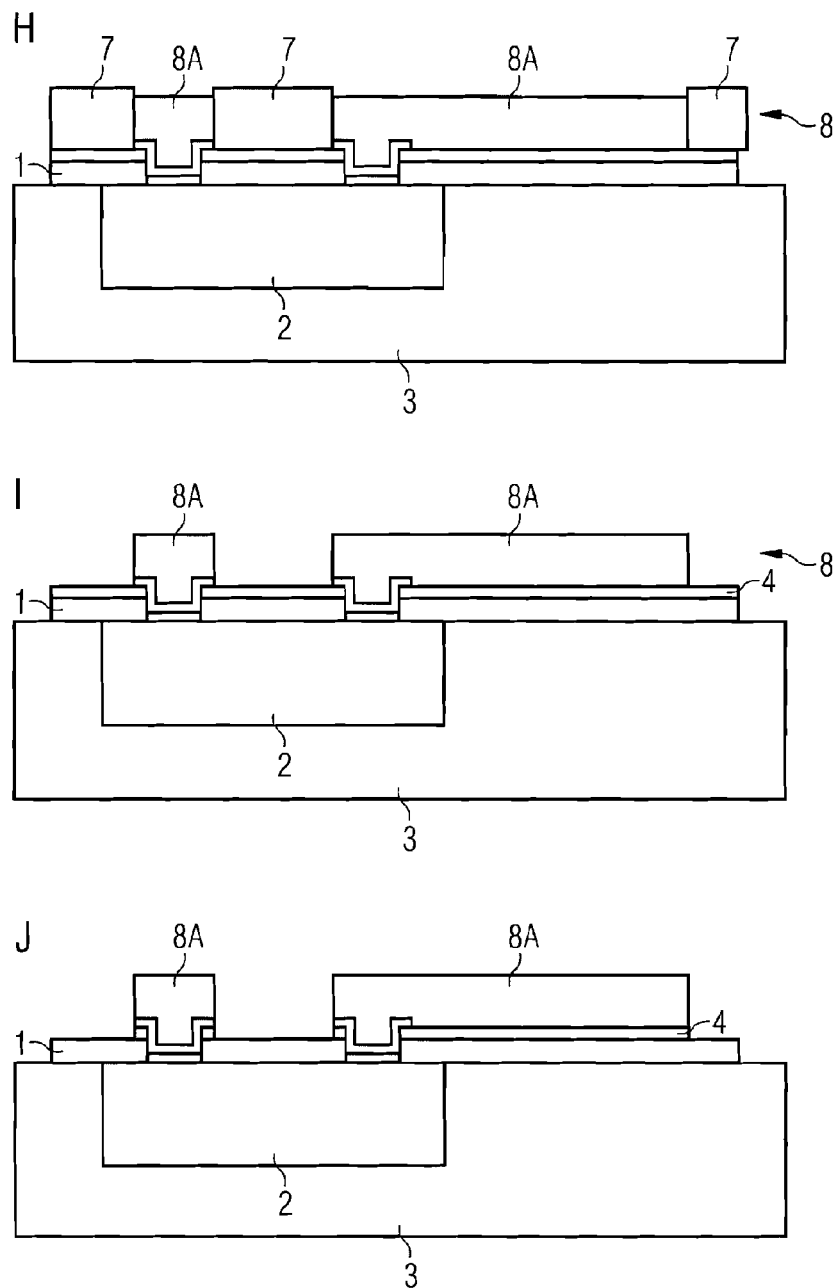

FIG 5
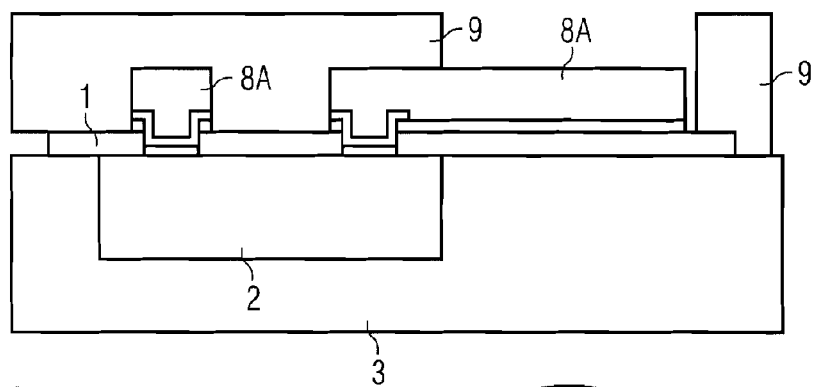
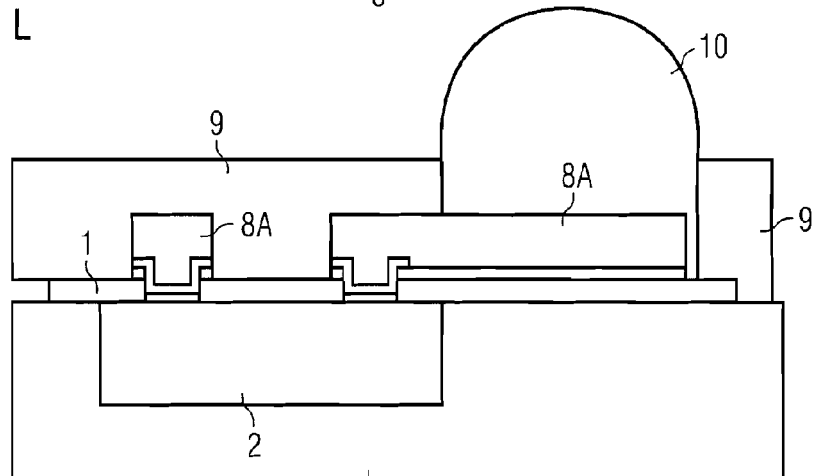
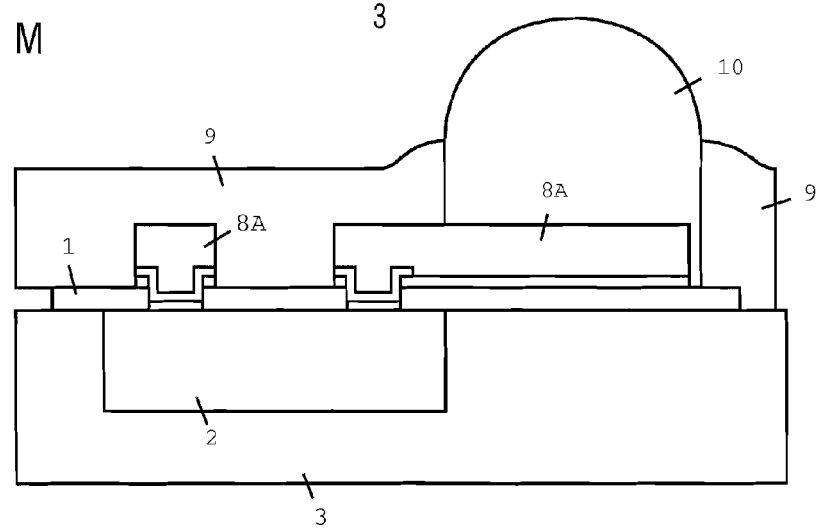

FIG 7
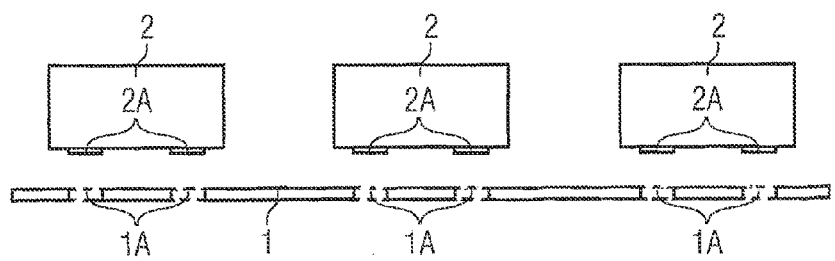
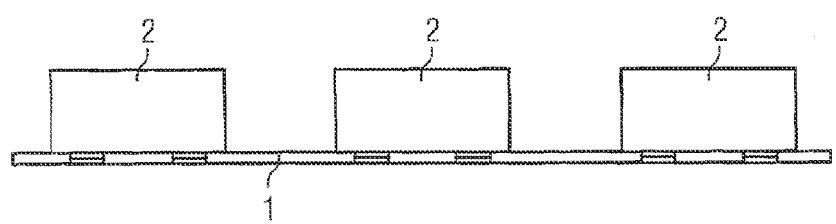
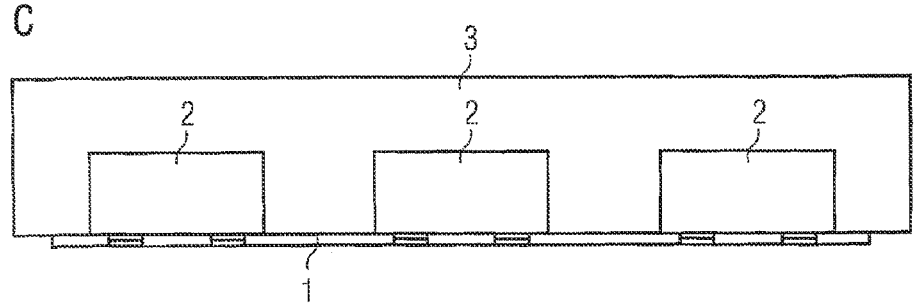

FIG 7
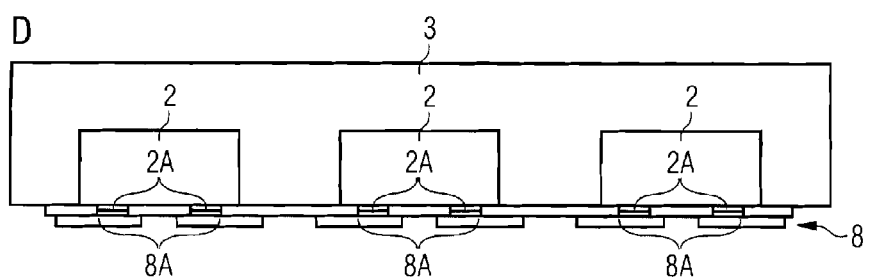
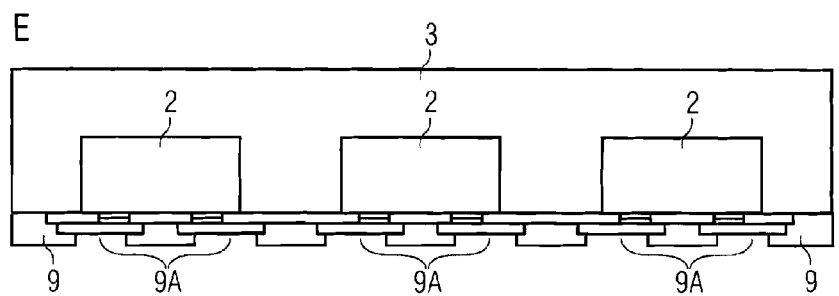
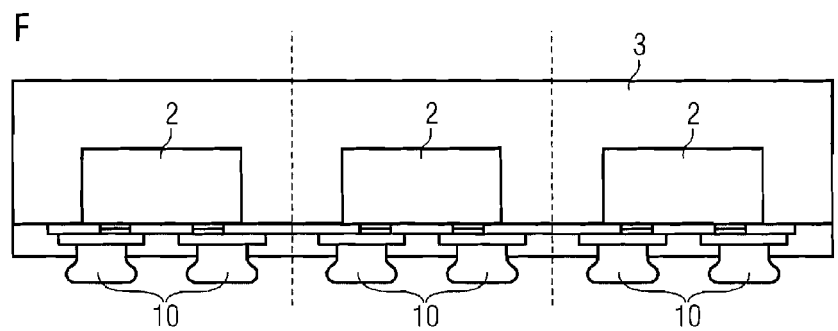

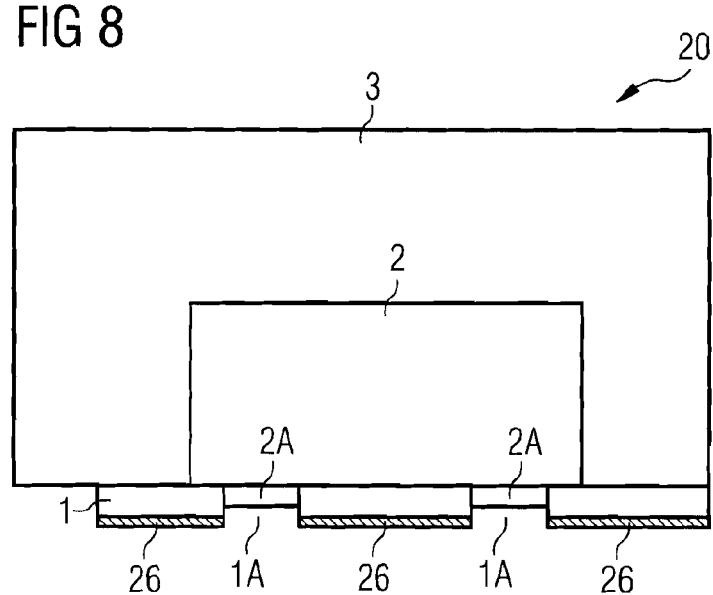
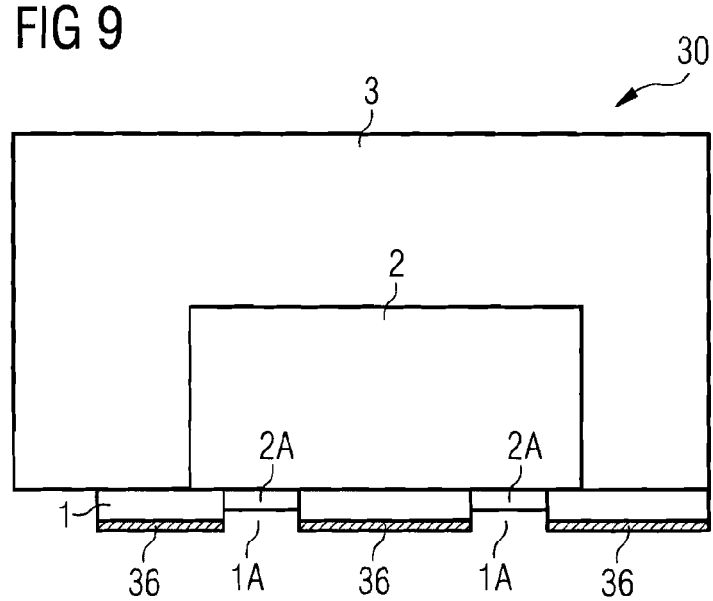

METHOD OF FABRICATING A SEMICONDUCTOR DEVICE WITH ENCAPSULANT

CROSS-REFERENCE TO RELATED APPLICATIONS

This application is a divisional of U.S. patent application Ser. No. 12/185,389, now abandoned, entitled "METHOD OF FABRICATING A SEMICONDUCTOR DEVICE HAVING CONTACT ELEMENTS AND SEMICONDUCTOR DEVICE," having a filing date of Aug. 4, 2008, and which is incorporated herein by reference.

BACKGROUND

The present invention relates to a method of fabricating a semiconductor device and a semiconductor device.

Semiconductor chips include contact pads of contact elements on one or more of their surfaces. When fabricating a semiconductor device, in one embodiment when housing the semiconductor chip in a semiconductor chip package, the contact pads of the semiconductor chip have to be connected to external contact elements of the semiconductor chip package.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 2A-D illustrate schematic cross-sectional representations of intermediate products and a semiconductor device for illustrating one embodiment of a method of fabricating a semiconductor device.

FIGS. 4A-D illustrate schematic cross-sectional representations of intermediate products and a semiconductor device for illustrating one embodiment of a method of fabricating a semiconductor device.

FIGS. 5A-M illustrate schematic cross-sectional representations of intermediate products and a semiconductor device for illustrating one embodiment of a method of fabricating a semiconductor device.

FIGS. 7A-F illustrate schematic cross-sectional representations of intermediate products and semiconductor devices for illustrating one embodiment of a method of fabricating a plurality of semiconductor devices.

FIG. 8 illustrates a schematic cross-sectional representation of a semiconductor devices according to one embodiment.

FIG. 9 illustrates a schematic cross-sectional representation of a semiconductor device according to one embodiment.

DETAILED DESCRIPTION

Figure 1:
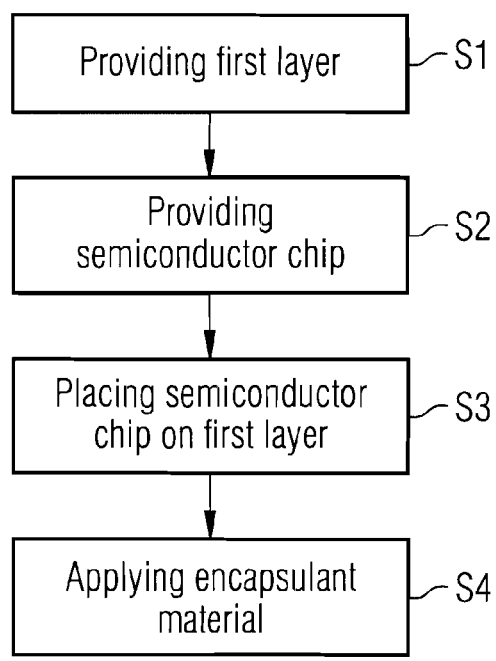
FIG. 1 illustrates a flow diagram of a method of fabricating a semiconductor device according to one embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

The aspects and embodiments are now described with reference to the drawings, wherein like reference numerals are generally utilized to refer to like elements throughout. In the following description, for purposes of explanation, numerous specific details are set forth in order to provide a thorough understanding of one or more aspects of the embodiments. It may be evident, however, to one skilled in the art that one or more aspects of the embodiments may be practiced with a lesser degree of the specific details. In other embodiments, known structures and elements are illustrated in schematic form in order to facilitate describing one or more aspects of the embodiments. It is to be understood that other embodiments may be utilized and structural or logical changes may be made without departing from the scope of the present invention. It should be noted further that the drawings are not to scale or not necessarily to scale.

In addition, while a particular feature or aspect of one embodiment may be disclosed with respect to only one of several implementations, such feature or aspect may be combined with one or more other features or aspects of the other implementations as may be desired and advantageous for any given or particular application. Furthermore, to the extent that the terms "include", "have", "with" or other variants thereof are used in either the detailed description or the claims, such terms are intended to be inclusive in a manner similar to the term "comprise". The terms "coupled" and "connected", along with derivatives may be used. It should be understood that these terms may be used to indicate that two elements co-operate or interact with each other regardless whether they are in direct physical or electrical contact, or they are not in direct contact with each other. Also, the term "exemplary" is merely meant as an example, rather than the best or optimal. The following detailed description, therefore, is not to be taken in a limiting sense, and the scope of the present invention is defined by the appended claims.

The embodiments of a method of fabricating a semiconductor device and the embodiments of a semiconductor device may use various types of semiconductor chips or semiconductor substrates, among them logic integrated circuits, analog integrated circuits, mixed signal integrated circuits, sensor circuits, MEMS (Micro-Electro-Mechanical Systems), power integrated circuits, chips with integrated passives, discrete passives and so on. In general the term "semiconductor chip" as used in this application can have different meanings one of which is a semiconductor die or semiconductor substrate including an electrical circuit.

In several embodiments layers or layer stacks are applied to one another or materials are applied or deposited onto layers. It should be appreciated that any such terms as "applied" or "deposited" are meant to cover literally all kinds and techniques of applying layer onto each other. In one embodiment, they are meant to cover techniques in which layers are applied at once as a whole, like, for example, laminating techniques, as well as techniques in which layers are deposited in a sequential manner, like, for example, sputtering, plating, molding, chemical vapor deposition (CVD) and so on.

The semiconductor chips may include contact elements or contact pads on one or more of their outer surfaces wherein the contact elements serve for electrically contacting the semiconductor chips. The contact elements may be made from any electrically conducting material, e.g., from a metal as aluminum, gold, or copper, for example, or a metal alloy, or an electrically conducting organic material, or an electrically conducting semiconductor material.

The semiconductor chips may become covered with an encapsulating material. The encapsulating material can be any electrically insulating material like, for example, any kind of molding material, any kind of epoxy material, or any kind of resin material. In special cases it could be advantageous to use a conductive encapsulant material. In the process of covering the semiconductor chips or dies with the encapsulating material, fan-out embedded dies can be fabricated. The fan-out embedded dies can be arranged in an array having the form e.g., of a wafer and will thus be called a "re-configured wafer" further below. However, it should be appreciated that the fan-out embedded die array is not limited to the form and shape of a wafer but can have any size and shape and any suitable array of semiconductor chips embedded therein.

Referring to FIG. 1, there is illustrated a flow diagram of a method of fabricating a semiconductor device according to one embodiment. The method includes providing a first layer, the first layer including through-holes (s1), providing at least one semiconductor chip, the semiconductor chip defining a first surface including contact elements and a second surface opposite to the first surface of the semiconductor chip (s2), placing the semiconductor chip onto the first layer with the first surface facing the first layer (s3), and applying an encapsulant material over the second surface of the semiconductor chip (s4).

According to one embodiment of the method of fabricating a semiconductor device, the method further includes placing the semiconductor chip onto the first layer with the contact elements being aligned with the through-holes.

According to one embodiment of the method of fabricating a semiconductor device, the through-holes are formed by at least one of stamping, laser drilling, or selectively etching the first layer.

According to one embodiment of the method of fabricating a semiconductor device, the first layer is an insulation layer.

According to one embodiment of the method of fabricating a semiconductor device, the first layer is comprised of a first insulation layer facing the semiconductor chip and a metal layer facing away from the semiconductor chip. The metal layer may include the function of a seed layer for a later metallization process.

According to one embodiment of the method of fabricating a semiconductor device, the first layer is attached to a second layer. According to a further embodiment thereof, the second layer is separated from the first layer after placing the semiconductor chip onto the first layer and the encapsulation.

According to one embodiment of the method of fabricating a semiconductor device, the method further includes applying a conducting layer over the first layer and the contact elements wherein the conducting layer may include conducting areas which are aligned with the through-holes and which can be electrically connected with the contact elements of the semiconductor chips by filling electrically conductive material into the through-holes. The conducting layer may include the function of a redistribution layer for redistributing the arrangement of the contact elements over a larger area.

According to one embodiment of the method of fabricating a semiconductor device, the method further includes applying solder balls and electrically connecting the solder balls with the contact elements of the semiconductor chip. According to one embodiment thereof, the method further includes applying a solder resist layer, the solder resist layer including openings wherein the solder balls are applied above the openings of the solder resist layer.

Referring to FIGS. 2A-D, there are illustrated cross-sectional representations of intermediate products and a semiconductor device for illustrating one embodiment of a method of fabricating a semiconductor device corresponding to the embodiment of FIG. 1. FIG. 2A illustrates a cross-sectional representation of a first layer 1 wherein the first layer 1 includes through-holes 1A. The first layer 1 can be made of a dielectric, insulating material which can, for example, be comprised of a foil based on an acrylate or which can also be an epoxy-bistage foil. The first layer 1 can, for example, also be made of a prepreg (preimpregnated) foil such as that known from conventional substrate technology. The first layer 1, for example, can be comprised of a photo-structurable prepreg which can be etched after lithographical exposure. It is also possible that the first layer 1 could be ablated or structured with a laser beam. The first layer 1 can also include an additive, which releases electrically conducting material or which releases a catalytic layer for plating upon irradiation. The first layer 1 can also have adhesion properties in order to fix semiconductor chips which are to be applied on its surface. If, however, the first layer 1 does not have itself sufficient adhesion force at its surface, a third layer (not illustrated) including an adhesion promoter can be applied to the surface of the first layer 1.

The through-holes 1A can be produced, for example, by one of stamping, laser drilling, or selective etching of the first layer 1.

FIG. 2B illustrates a cross-sectional representation of a semiconductor chip 2 including a first surface having contact elements or contact pads 2A thereon, and a second surface opposite to the first surface. The semiconductor chips to be used here may be of extremely different types and may include integrated electrical or electro-optical circuits. The semiconductor chips may be, for example, configured as power transistors, power diodes, control circuits, micro-processors or micro-electro-mechanical components or discrete passives. The semiconductor chips need not necessarily be manufactured from specific semiconductor material and, furthermore, may contain inorganic and/or organic materials that are not semiconductors, such as, for example, insulators, plastics or metals.

FIG. 2C illustrates an intermediate product after applying the semiconductor chip 2 to the first layer 1. The semiconductor chip 2 is placed onto the first layer 1 with the first surface of the semiconductor chip 2 facing the first layer 1. The semiconductor chip 2 can be placed in such a way onto the first layer 1 that the contact elements 2A of the semiconductor chip 2 are aligned with the through-holes 1A of the first layer 1. The semiconductor chip 2 can be placed by different means onto the first layer 1 wherein, for example, in case of placing a plurality of semiconductor chips 2 onto the first layer 1, a pick-and-place machine can be used. A pattern recognition of the through-holes can be implemented for placing the semiconductor chip in the correct position.

FIG. 2D illustrates a cross-sectional representation of a semiconductor device after applying an encapsulant material 3 over the semiconductor chip 2. The encapsulant material 3 can, for example, include a molding material wherein the molding technique can be, for example, compression molding. The encapsulant material can also be applied by other process techniques like, for example, screen printing. The encapsulant materials include, for example, aliphatic and aromatic polymers including thermoplastic and thermoset type polymers and blends of these and also other various types of polymers.

Typical values of the thicknesses of the layers may be as follows. The thickness of the first layer 1 typically ranges from 5 µm to 150 µm, whereas the thickness of the semiconductor chip 2 typically ranges from 50 µm to 450 µm, and the thickness of the encapsulant material typically ranges from 300 µm to 700 µm.

Figure 3:
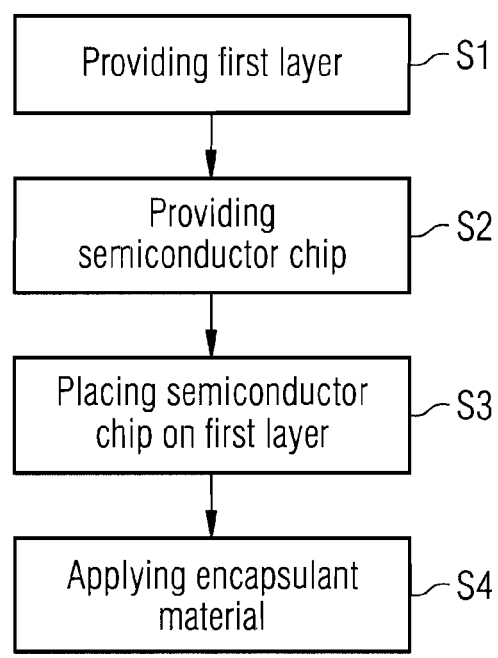
FIG. 3 illustrates a flow diagram of a method of fabricating a semiconductor device according to one embodiment.

Referring to FIG. 3, there is illustrated a flow diagram of a method of fabricating a semiconductor device according to one embodiment. The method includes providing a first layer, the first layer including through-holes (s1), providing at least one semiconductor chip, the semiconductor chip including contact elements (s2), placing the semiconductor chip onto the first layer with the contact elements being aligned with the through-holes (s3), and applying an encapsulant material over the semiconductor chip.

According to one embodiment of the method of fabricating a semiconductor device, the method further includes the semiconductor chip defining a first surface including the contact elements and a second surface opposite to the first surface, and placing the semiconductor chip onto the first layer with the first surface facing the first layer.

There can be provided further embodiments of the method of fabricating a semiconductor device corresponding with the embodiment as described above in connection with the semiconductor device as depicted in FIGS. 1 and 2.

Referring to FIGS. 4A-D, there are illustrated cross-sectional representations of intermediate products and a semiconductor device for illustrating one embodiment of a method of fabricating a semiconductor device corresponding to the embodiment of FIG. 3. FIG. 4A illustrates a cross-sectional representation of a first layer 1 wherein the first layer 1 includes through-holes 1A. The first layer 1 can be made of a dielectric, insulating material which can, for example, be comprised of a foil based on an acrylate or which can also be an epoxy-B-stage foil. The first layer 1 can, for example, also be made of a prepreg (preimpregnated) foil such as that known from conventional substrate technology. The first layer 1, for example, can be comprised of a photo structurable prepreg which can be etched after lithographical exposure. It is also possible that the first layer 1 could be ablated or structured with a laser beam. The first layer 1 can also include an additive, which releases electrically conducting material or which releases a catalytic layer for plating upon irradiation. The first layer 1 can also have adhesion properties in order to fix semiconductor chips which are to be applied on its surface. If, however, the first layer does not have itself sufficient adhesion force at its surface, a third layer (not illustrated) including an adhesion promoter can be applied to the surface of the first layer 1.

The through-holes 1A can be produced, for example, by stamping, laser drilling, or etching of the first layer 1.

FIG. 4B illustrates a cross-sectional representation of a semiconductor chip including a first surface having contact elements or contact pads 2A thereon, and a second surface opposite to the first surface. The semiconductor chips to be used here may be of extremely different types and may include for integrated electrical or electro-optical circuits. The semiconductor chips may be, for example, configured as power transistors, power diodes, control circuits, micro-processors or micro-electro-mechanical components. The semiconductor chips need not be manufactured from specific semiconductor material and, furthermore, may contain inorganic and/or organic materials that are not semiconductors, such as, for example, insulators, plastics or metals.

FIG. 4C illustrates an intermediate product after applying the semiconductor chip 2 to the first layer 1. The semiconductor chip 2 is placed onto the first layer 1 with the first surface of the semiconductor chip 2 facing the first layer 1. The semiconductor chip 2 can be placed in such a way onto the first layer 1 that the contact elements 2A of the semiconductor chip 2 are aligned with the through-holes 1A of the first layer 1. The semiconductor chip 2 can be placed by different means onto the first layer 1 wherein, for example, in case of placing a plurality of semiconductor chips 2 onto the first layer 1, a pick-and-place machine can be used.

FIG. 4D illustrates a cross-sectional representation of a semiconductor device after applying an encapsulant material 3 over the semiconductor chip 2. The encapsulant material 3 can, for example, include a molding material wherein the molding technique can be, for example, compression molding. The encapsulant material can also be applied by other process techniques like, for example, screen printing. The encapsulant materials include, for example, aliphatic and aromatic polymers including thermoplastic and thermoset type polymers and blends of these and also other various types of polymers.

Typical values of the thicknesses of the layers may be as follows. The thickness of the first layer 1 typically ranges from 5 µm to 150 µm, whereas the thickness of the semiconductor chip 2 typically ranges from 150 µm to 450 µm, and the thickness of the encapsulant material typically ranges from 300 µm to 700 µm.

According to one embodiment of the embodiments as described in this application, the through-holes are formed into the first layer in a stage of the process in which the at least one semiconductor chip has not yet been applied to the first layer. Therefore, there are no specific restrictions in handling of the first layer and no particular measures to be taken in order to prevent any damages. The through-holes can therefore be easily formed by any sort of process like, for example, stamping of the first layer, laser drilling or laser structuring of the first layer, selective etching of the first layer and so on. Furthermore, a metallic layer can be grown on or deposited on the first layer which metallic layer is to be utilized for later electro plating or galvanic processes. The metallic layer can also be deposited onto the first layer without any particular restrictions or measures to be taken. A further advantage lies in the fact that the semiconductor chips can be applied to the first layer and they can be easily placed onto the first layer with the contact elements of the semiconductor chips being aligned with the through-holes of the first layer. The through-holes can be utilized for a pattern recognition of an automated process of placing of the semiconductor chips by using, for example, a pick-and-place-machine.

Referring to FIGS. 5A-M, there are illustrated cross-sectional representations of intermediate products and semiconductor devices for illustrating a method of fabricating a semiconductor device according to one embodiment. FIG. 5A illustrates a layer stack including a first layer 1 which may correspond to the first layer 1 as described in the previous embodiments, i.e. which may be fabricated of a dielectric resin. On one surface of the first layer 1 a thin metallic layer 4 is deposited. The metallic layer 4 serves the purpose of a seed layer utilized to assist a metallization plating process, e.g., a galvanic metallization process, which is performed in a later process for the fabrication of a redistribution layer. The metallic layer 4 can have a thickness in a range from 20 nm to 300 nm. It can be deposited as a single layer of, for example, an element metal like Ti or Cu or it can be deposited as a layer stack including, for example, a 50 nm Ti layer and a Cu layer of a thickness between 100 nm and 200 nm. The metallic layer 4 can be produced by different ways. It, for example, can be produced by depositing onto the surface of the first layer 1, in one embodiment by sputtering. It is also possible to choose a specific material of the first layer 1, the specific material containing an additive, which releases electrically conducting material upon irradiation. The specific material may also release upon irradiation a catalytic starter for a subsequent plating process. It is also possible to omit the metallic layer 4 which will be explained further below. The layer stack as illustrated in FIG. 5A also illustrates an auxiliary layer 5 which is applied onto the first layer 1 or the metallic layer 4. The auxiliary layer 5 may include the form of a transparent tape and it may serve the purpose of a protection tape which is to be removed in a later stage.

FIG. 5B illustrates a cross sectional representation of a further intermediate product. The intermediate product of FIG. 5B is obtained after producing through-holes 1A into the first layer 1. The through-holes 1A can be produced by photo-structuring of the first layer 1 by using a laser beam if the first layer 1 is made of a photo-structurable material. If the material of the first layer 1 is not only comprised of a photo-structurable material but also contains an additive, which releases electrically conducting material as described above, it would be possible to generate the through-holes 1A and at the same time to generate a thin electrically conducting surface layer at the walls of the through-holes 1A. The structuring of the first layer 1 by laser irradiation can be performed e.g., by a scanned laser beam or by an optical imaging system including a conventional (incoherent) light source, a mask and a lens. The structuring of the first layer 1 can also be performed by a stamping process or by a selective etching process of the first layer 1.

FIG. 5C illustrates a cross-sectional representation of a further intermediate product obtained after applying of a semiconductor chip 2 to the first layer 1. The semiconductor chip 2 will be placed onto a surface of the first layer 1 which is situated opposite to the (optional) metallic layer 4 and the (optional) auxiliary layer 5. The semiconductor chip 2 includes contact elements 3A and will be placed such that the contact elements 3A are aligned with the through-holes 1A of the first layer 1. The semiconductor chip 2 can be placed by use of a pick-and-place-machine which can be equipped with a pattern recognition tool using the through-holes 1A as an orientation for the placement process. In the embodiment of FIGS. 5A-M only two contact elements 2A per chip 2 are illustrated. However, it should be noted that the chip 2 can have even more contact elements.

FIG. 5D illustrates a cross-sectional representation of a further intermediate product obtained after applying an encapsulant material 3 onto the semiconductor chip 2. The encapsulant material can be made of any material as described in one of the previous embodiments. The encapsulant material can be applied in such a way onto the semiconductor chip 2 so that the semiconductor chip 2 is embedded in the encapsulant material, in one embodiment surrounded by the encapsulant material on all sides besides the surface on which the contact elements 2A are provided. After applying of the encapsulant material, a tempering or curing process is performed for curing or hardening the encapsulant material.

FIG. 5E illustrates a cross-sectional representation of a further intermediate product obtained after removing the auxiliary layer 5 and filling a conductive ink 6 into the through-holes 1A. The intermediate product is illustrated upside down with respect to the previous drawing of FIG. 5D. The conductive ink 6 can be comprised of, for example, any liquid medium in which electrically conductive particles, in one embodiment microscopic particles like nano-particles are embedded wherein e.g., silver nano-particles could be used. The through-holes 1A could be filled each with an amount of 3 to 40 pl per drop of conductive ink 6. The application of the conductive ink 6 and the subsequent drying and/or curing provides a conducting seed layer on the bottom of the through-holes 1A, i.e. on the contact elements 2A of the semiconductor chip 2 and the side walls of the through-holes 1A. The ink jetting can also be performed with the help of pattern recognition on the basis of the location of the through-holes 1A. The curing of the deposited ink could be performed in a way that the encapsulant material 3 will be cured or post-cured at the same time. The curing temperature should be higher than 150° C., in one embodiment higher than 200° C. in order to ensure a good conductivity of the cured conductive ink 6. After curing of the conductive ink 6 the walls of the through-holes 1A and the contact elements 2A are covered with a conductive material, the conductive material being comprised of conductive particles embedded in a matrix.

In one embodiment, no metallic layer 4 is applied to the first layer 1 when fabricating the intermediate product of FIG. 5A; so when fabricating the intermediate product of FIG. 5E, the conductive ink 6 is applied to the whole upper surface of the first layer 1 including the through-holes 1A.

In FIG. 5F there is illustrated a cross-sectional representation of a further intermediate product after application of a resist layer 7 onto the upper surface of the metallic layer 4 and the through-holes 1A of the first layer 1. The resist layer 7 can be comprised of a dry resist or a sprayed resist which may have a thickness of, for example, 10 µm-30 µm, in one embodiment 15 µm. The resist layer 7 can be laminated onto the surface of the metallic layer 4 if it is in the form of a dry resist.

FIG. 5G illustrates a cross-sectional representation of a further intermediate product after exposing and developing the resist layer 7. The resist layer 7, for example, can be exposed with a laser direct imaging (LDI) process or with any other conventional imaging method. After developing of the resist layer 7, predetermined portion of the resist layer are removed in order to fabricate electrically conductive contact areas thereon.

FIG. 5H illustrates a cross-sectional representation of a further intermediate product after forming contact areas 8A into the through-holes 1A and on the regions of the metallic layer 4 which are connected with the through-holes 1A, respectively. The contact areas 8A are intended to form part of a redistribution layer 8 for redistributing the distribution of the contact elements 2A to a larger area. The contact areas 8A can, for example, be fabricated by electro-plating in a strong agitated electrolyte. In FIG. 5H there is illustrated only one contact area 8A to its full extent, the contact area 8A being connected with the right one of the through-holes 1A as illustrated. It is to be understood that the other contact areas 8A may also be fabricated with the same geometric dimensions, wherein, for example, the contact area 8A connected with the left through-hole 1A may extend in a direction perpendicular to the image plane. The contact areas 8A can be produced by galvanic plating or by other means like, for example, chemical plating or even by a screen printing process.

FIG. 5I illustrates a cross-sectional representation of a further intermediate product after etching of the remaining portions of the resist layer 7.

FIG. 5J illustrates a cross-sectional representation of a further intermediate product obtained after etching of the remaining portions of the metallic layer 4 under the remaining portions of the resist layer 7 removed in the process before so that the contact areas 8A of the redistribution layer 8 become electrically separated from each other. In case of the above-mentioned alternative embodiment in which no metallic layer is deposited onto the first layer 1 from the beginning but instead a conductive ink layer is applied onto the entire surface of the first layer 1 to obtain the intermediate product of FIG. 5E, the remaining portions of the conductive ink layer are removed between the contact areas 8A. In the case of screen printing no seed layer will have to be applied.

FIG. 5K illustrates a cross sectional representation of a further intermediate product obtained after applying and structuring of a solder resist layer 9. The solder resist layer 9 is structured so that essential or large portions of the contact areas 8A are not covered by the solder resist layer 9.

In FIG. 5L there is illustrated a cross-sectional representation of a further intermediate product obtained after filling solder balls 10 into the openings of the solder resist layer 9 so that each solder ball 10 is connected with one of the contact areas 8A of the redistribution layer 8, respectively.

In FIG. 5M there is illustrated a cross-sectional representation of a further intermediate product obtained after applying further material of the solder resist in regions at the bottom of the solder balls 10 in order to stabilize and strengthen the fixation of the solder balls 10 within the openings of the solder resist layer 9.

Figure 6:
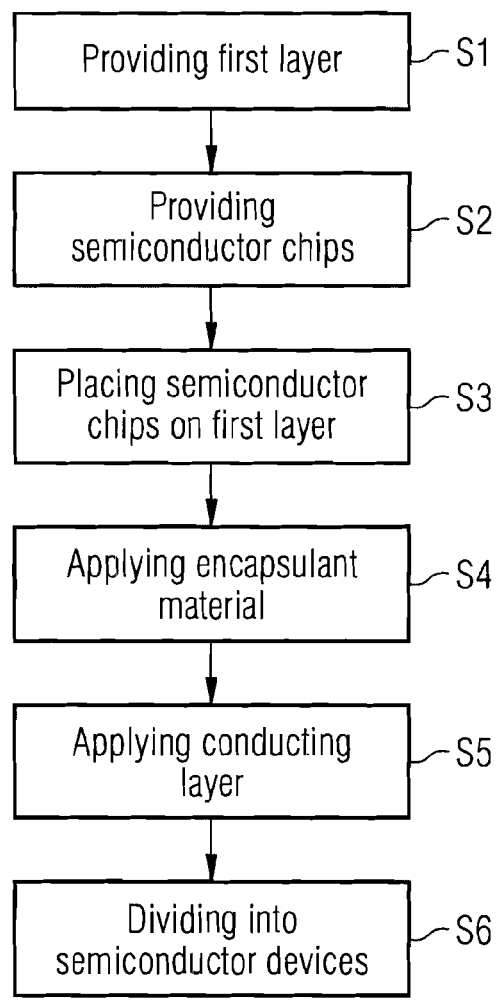
FIG. 6 illustrates a flow diagram of a method of fabricating a plurality of semiconductor devices according to one embodiment.

Referring to FIG. 6, there is illustrated a flow diagram of a method of fabricating a plurality of semiconductor devices according to one embodiment. The method includes providing a first layer, the first layer including through-holes (s1), providing a plurality of semiconductor chips, each one of the semiconductor chips defining a first surface including contact elements and a second surface opposite to the first surface of the semiconductor chips and side surfaces between the first and second surfaces, respectively (s2), placing the semiconductor chips onto the first layer with the first surface facing the first layer (s3), applying an encapsulant material over at least the side surfaces of the semiconductor chips (s4), applying a conducting layer over the first layer and the contact elements, the conducting layer including conducting areas, each one of the conducting areas connected with one of the contact elements, respectively (s5), and dividing the resulting structure into semiconductor devices (s6).

According to one embodiment of the method of fabricating a plurality of semiconductor devices, the method further includes placing the semiconductor chips onto the first layer with the contact elements being aligned with the through-holes.

According to one embodiment of the method of fabricating a plurality of semiconductor devices, the through-holes are formed by at least one of stamping, laser drilling, or selective etching the first layer.

According to one embodiment of the method of fabricating a plurality of semiconductor devices, the first layer is an insulating layer.

According to one embodiment of the method of fabricating a plurality of semiconductor devices, the first layer is comprised of a first insulation layer facing the semiconductor chips and a metal layer facing away from the semiconductor chips.

According to one embodiment of the method of fabricating a plurality of semiconductor devices, the first layer is attached to a second layer. According to a further embodiment thereof, the second layer is separated from the first layer after placing the semiconductor chips onto the first layer and encapsulating the semiconductor chips.

Referring to FIGS. 7A-E, there are illustrated cross-sectional representations of intermediate products and semiconductor devices for illustrating a method of fabricating a plurality of semiconductor devices according to one embodiment of the embodiment as depicted in FIG. 6. This embodiment illustrates a complete embedding packaging process. FIG. 7A illustrates a cross-sectional representation of a first layer 1, the first layer 1 including through-holes 1A, and of a plurality of semiconductor chips 2, wherein each one of the semiconductor chips 2 defines a first surface including contact elements 2A and a second surface opposite to the first surface of the semiconductor chips 2, respectively.

FIG. 7B illustrates a cross-sectional representation of an intermediate product obtained after placing the plurality of semiconductor chips 2 onto the first layer 1 with the first surface of the semiconductor chips 2 facing the first layer 1. The semiconductor chips 2 are placed onto the first layer 1 with a sufficient spacing from each other in order to allow a fan-out of the electrical contacts. A pick-and-place-machine can be used for placing the semiconductor chips 2 onto the first layer 1. There are illustrated three semiconductor chips 2 which is to be understood only as an example. In fact the number of semiconductor chips can be much higher than that and the semiconductor chips 2 can be placed in the form of a regular array onto the first layer 1. Also the semiconductor chip 2 can represent a multichip arrangement resulting in a system-in-package (SIP).

In FIG. 7C there is illustrated a cross-sectional representation of a further intermediate product obtained after applying an encapsulant material 3 onto the semiconductor chips 2 so that the semiconductor chips 2 are embedded in the encapsulant material 3. The encapsulant material can be applied by, for example, molding, in one embodiment by using a mold form corresponding to the form of a wafer so that an embedded wafer can be formed.

FIG. 7D illustrates a cross-sectional representation of a further intermediate product obtained after applying a conducting layer 8 over the first layer 1 and the contact elements 2A, the conducting layer 8 including conducting areas 8A, each one of the conducting areas 8A connected with one of the contact elements 2A of the semiconductor chips 2, respectively.

FIG. 7E illustrates a cross-sectional representation of an intermediate product obtained after applying a solder resist layer 9. The solder resist layer 9 is structured after being applied so that it forms openings 9A, the openings 9A of the solder resist layer 9 being aligned with the contact areas 8A of the conducting layer 8. According to a further embodiment the solder resist is applied in a structured form by, for example, a printing process like e.g., ink jetting or screen or stencil printing.

FIG. 7F illustrates a cross-sectional representation of an intermediate product obtained after filling solder balls 10 into the openings 9A of the solder resist layer 9. The solder balls 10 are thus electrically connected to the contact areas 8A and extend outwardly over the surface of the solder resist layer 9.

Finally, as illustrated by the dashed lines, the resulting structure is divided along the dashed lines to reveal a plurality of semiconductor devices.

In FIG. 8 there is illustrated a cross-sectional representation of a semiconductor device or a semiconductor chip package according to one embodiment. The semiconductor chip package 20 includes at least one semiconductor chip 2 including contact elements 2A on a first surface of the semiconductor chip 2, an encapsulant material 3 covering at least partly the semiconductor chip 2, a dielectric layer 1 situated on the first surface of the semiconductor chip 2, the dielectric layer 1 including through-holes 1A aligned with the contact elements 2A, and a layer 26 of a conductive material covering a surface of the dielectric layer 1 above the through-holes 1A, the conductive material being produced by applying conductive ink to the surface and one or more of drying, curing and sintering the conductive ink.

According to one embodiment of the semiconductor device 20, the semiconductor device 20 further includes a conducting layer including conducting areas, each one of the conducting areas connected with respective contact elements 2A by an electrically conducting material filled in the through-holes 1A, respectively, wherein the conducting material can be conductive ink. According to a further embodiment thereof, the semiconductor device 20 further includes a solder resist layer applied above the conducting layer, the solder resist layer including openings above the conducting areas. According to a further embodiment thereof, the semiconductor device 20 further includes solder balls applied above the openings of the solder resist layer, the solder balls being electrically connected to the contact areas, respectively.

Referring to FIG. 9, there is illustrated a cross-sectional representation of a semiconductor device according to one embodiment. The semiconductor device 30 as illustrated in FIG. 9 includes at least one semiconductor chip 2 including contact elements 2A on a first surface of the semiconductor chip 2, an encapsulant material 3 covering at least partly the semiconductor chip 2, a dielectric layer 1 situated on the first surface of the semiconductor chip 2, the dielectric layer 1 including through-holes 1A aligned with the contact elements 2A, and a layer 36 of a conductive material covering a surface of the dielectric layer 1 above the through-holes 1A, the conductive material being comprised of conductive particles embedded in a matrix.

According to one embodiment of the semiconductor device 30, the semiconductor device 30 further includes a conducting layer including conducting areas, each one of the conducting areas connected with respective contact elements 2A by an electrically conducting material filled in the through-holes 1A, respectively, wherein the conducting material can be conductive ink or conductive paste. According to a further embodiment thereof, the semiconductor device 30, further includes a solder resist layer applied above the conducting layer, the solder resist layer including openings above the contact areas. According to a further embodiment thereof, the semiconductor device 30 further includes solder balls applied above the openings of the solder resist layer, the solder balls being electrically connected to the contact areas, respectively.

Figure 10:
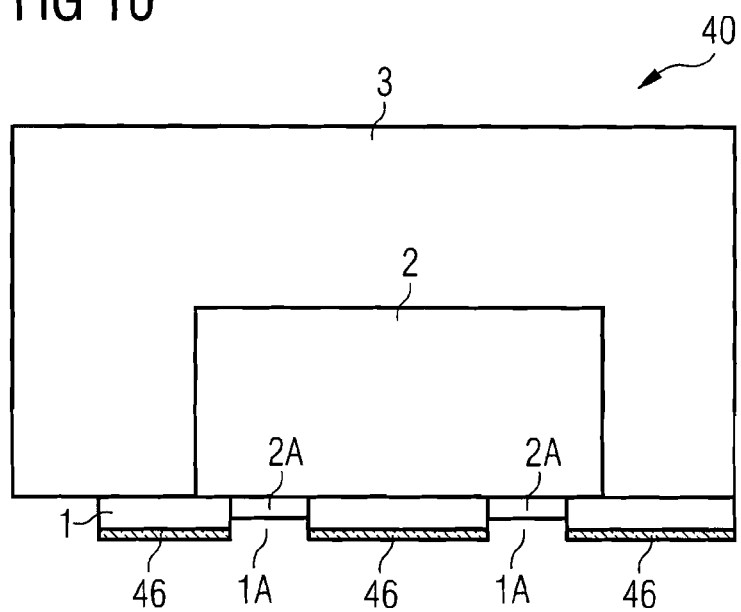
FIG. 10 illustrates a schematic cross-sectional representation of a semiconductor device according to one embodiment.

In FIG. 10 there is illustrated a cross-sectional representation of a semiconductor device or a semiconductor chip package according to one embodiment. The semiconductor chip package 40 includes at least one semiconductor chip 2 including contact elements 2A on a first surface of the semiconductor chip 2, an encapsulant material 3 covering at least partly the semiconductor chip 2, a dielectric layer 1 situated on the first surface of the semiconductor chip 2, the dielectric layer 1 including through-holes 1A aligned with the contact elements 2A, and a layer 46 of a conductive material covering a surface of the dielectric layer 1 above the through-holes 1A, the layer 46 being produced by a sputtering process. According to one embodiment the layer 46 is a sputtered metallic layer including an element metal or metal alloy.

According to one embodiment of the semiconductor device 40, the semiconductor device 40 further includes a conducting layer including conducting areas, each one of the conducting areas connected with respective contact elements 2A by an electrically conducting material filled in the through-holes 1A, respectively, wherein the conducting material can be conductive ink. According to a further embodiment thereof, the semiconductor device 20 further includes a solder resist layer applied above the conducting layer, the solder resist layer including openings above the conducting areas. According to a further embodiment thereof, the semiconductor device 20 further includes solder balls applied above the openings of the solder resist layer, the solder balls being electrically connected to the contact areas, respectively.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of fabricating a semiconductor device, comprising:
    providing a first layer, the first layer comprising through-holes;
    providing at least one semiconductor chip, the semiconductor chip defining a first surface comprising contact elements and a second surface opposite to the first surface of the semiconductor chip;
    placing the semiconductor chip onto the first layer with the first surface facing the first layer and with the contact elements of the first surface of the semiconductor chip being aligned and extending within the through-holes such that there is no intermediate material between the through-holes and the contact elements;
    applying an encapsulant material over the second surface of the semiconductor chip until the encapsulant material contacts the first layer thereby substantially surrounding the semiconductor chip except for the first surface;
    applying a conductive ink into the through-holes of the first layer and directly onto the contact elements of the semiconductor chip such that there is no intermediate material between the contact elements and the conductive ink;
    wherein the contact elements on the semiconductor chip are characterized by the absence of solder, solder balls, bumps, or gold bumps when the semiconductor chip is placed onto the first layer with the first surface facing the first layer; and
    curing or post-curing the encapsulant material at the same time as curing the applied conductive ink.

2. The method of claim 1, further comprising forming the through-holes by at least one of stamping, laser drilling, and selective etching the first layer.

3. The method of claim 1, wherein the first layer is an insulating layer.

4. The method of claim 1, wherein a metallization layer is applied to the first layer prior to the application of the conductive ink.

5. The method of claim 1, further comprising applying the conductive ink into the through-holes of the first layer and directly onto the contact elements of the semiconductor chip and to the entire surface of the first layer.

6. The method of claim 1, further comprising fabricating the conductive ink from microscopic conductive particles in a liquid medium.

7. The method of claim 1, further comprising fabricating an encapsulated structure having a rectangular shape.

8. A method of fabricating a semiconductor device, comprising:
   providing a first layer, the first layer comprising through-holes;
   providing at least one semiconductor chip, the semiconductor chip comprising contact pads;
   placing the semiconductor chip onto the first layer with the contact pads being aligned with extending within the through-holes such that there is no intermediate material between the through-holes and the contact pads of the at least one semiconductor chip;
   applying an encapsulant material in a single layer over the semiconductor chip until the encapsulant material contacts the first layer thereby substantially surrounding the semiconductor chip;
   applying a conductive ink into the through-holes of the first layer and directly onto the contact pads of the semiconductor chip and curing or post-curing the encapsulant material at the same time as curing the applied conductive ink; and
   wherein the contact pads on the semiconductor chip are characterized by the absence of any connecting balls, bumps or other additional attachments thereto when the semiconductor chip is placed onto the first layer with the first surface facing the first layer.

9. The method of claim 8, further comprising:
   the semiconductor chip defining a first surface comprising the contact pads and a second surface opposite to the first surface, and
   placing the semiconductor chip onto the first layer with the first surface facing the first layer.

10. The method of claim 8, further comprising forming the through-holes by at least one of stamping, laser drilling, or selective etching the first layer.

11. The method of claim 8, wherein the first layer is an insulating layer.

12. The method of claim 8, wherein the first layer is comprised of a first insulation layer facing the semiconductor chip and a metal layer facing away from the semiconductor chip.

13. The method of claim 8, further comprising attaching the first layer to a second layer.

14. The method of claim 13, further comprising separating the second layer from the first layer after placing the semiconductor chip onto the first layer.

15. The method of claim 8, further comprising fabricating an encapsulated structure having a shape of a wafer.

16. The method of claim 8, further comprising fabricating an encapsulated structure having a rectangular shape.

17. A method of fabricating a plurality of semiconductor devices, comprising:
   providing a first layer, the first layer comprising through-holes prior to coupling with a semiconductor component;
   providing a plurality of semiconductor chips, each one of the semiconductor chips defining a first surface comprising contact elements and a second surface opposite to the first surface of the semiconductor chips and side surfaces between the first and second surfaces, respectively;
   placing the semiconductor chips onto the first layer with the first surface facing the first layer and with the contact elements being aligned and extending within the through-holes such that there is no intermediate material between the through-holes and the contact elements of the semiconductor chips;
   wherein the contact elements on the semiconductor chips are free of bumps, balls or any other attachments when the semiconductor chips are placed onto the first layer with the first surface facing the first layer;
   applying an encapsulant material over at least the side surfaces of the semiconductor chips;
   applying a conducting layer over the first layer and the through-holes directly onto the contact elements, the conducting layer comprising conducting areas, each one of the conducting areas connected with one of the contact elements, respectively; and
   dividing the resulting structure into semiconductor devices.

18. The method of claim 17, further comprising forming the through-holes by at least one of stamping, laser drilling, or selective etching the first layer.

19. The method of claim 17, wherein the first layer is an insulating layer.

20. The method of claim 17, wherein the first layer is comprised of a first insulation layer facing the semiconductor chips and a metal layer facing away from the semiconductor chips.

21. The method of claim 17, further comprising attaching the first layer to a second layer.

22. The method of claim 21, further comprising separating the second layer from the first layer after placing the semiconductor chips onto the first layer.

23. The method of claim 17, further comprising fabricating an encapsulated structure having a shape of a wafer.

24. The method of claim 17, further comprising fabricating an encapsulated structure having a rectangular shape.

* * * * *